United States Patent
Chen

(10) Patent No.: US 6,697,003 B1
(45) Date of Patent: Feb. 24, 2004

(54) SYSTEM AND METHOD FOR DYNAMIC ELEMENT MATCHING

(75) Inventor: Feng Chen, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/417,616

(22) Filed: Apr. 17, 2003

(51) Int. Cl.⁷ .............................. H03M 3/00
(52) U.S. Cl. ............... 341/143; 341/144; 341/155
(58) Field of Search .................. 341/143, 144, 341/155

(56) References Cited

U.S. PATENT DOCUMENTS

| | | | |
|---|---|---|---|
| 5,221,926 A | 6/1993 | Jackson | 341/118 |
| 5,305,004 A | 4/1994 | Fattaruso | 341/120 |
| 6,266,002 B1 | 7/2001 | Gong et al. | 341/150 |
| 6,304,608 B1 | 10/2001 | Chen et al. | 375/252 |
| 6,380,874 B1 | 4/2002 | Knudsen | 341/118 |
| 6,384,761 B1 | 5/2002 | Melanson | 341/143 |
| 6,426,714 B1 | 7/2002 | Ruha et al. | 341/143 |
| 6,445,318 B1 * | 9/2002 | Ruha et al. | 341/131 |
| 6,466,147 B1 | 10/2002 | Jensen et al. | 341/144 |
| 6,518,899 B2 | 2/2003 | Yu | 341/118 |
| 6,577,257 B2 * | 6/2003 | Brooks | 341/131 |
| 6,583,742 B1 * | 6/2003 | Hossack | 341/144 |

OTHER PUBLICATIONS

"An Analysis of the Partial Randomization Dynamic Element Matching Technique", IEEE Transactions on Circuits and System—II: Analog and Digital Signal Processing, vol. 45, No. 12, Dec., 1998, pp. 1538–1549.

"A Low–Complexity Dynamic Element Matching DAC for Direct Digital Synthesis", IEEE Transactions on Circuits and Systems—II: Analog and Digital Signal Processing, vol. 45, No. 1, Jan., 1998, pp. 13–27.

"An Improved Technique for Reducing Baseband Tones in Sigma–Delta Modulators Employing Data Weighted Averaging Algorithm Without Adding Dither", IEEE Transactions on Circuits and systems—II: Analog and Digital Signal Processing, vol. 46, No. 1, Jan., 1999, pp. 63–68.

\* cited by examiner

Primary Examiner—Peguy JeanPierre
(74) Attorney, Agent, or Firm—Ronald O. Neerings; W. James Brady, III; Frederick J. Telecky, Jr.

(57) ABSTRACT

Dynamic element matching systems and methods are provided in which a current dynamic element matching code is generated according to a previous dynamic element matching code, a digital input code, and a dither code. The current dynamic element matching code is then used along with the digital input code to select digital to analog converter elements.

38 Claims, 13 Drawing Sheets

60 → NO DEM

| DI | 4 | 8 | 17 | 17 | ... |
|---|---|---|---|---|---|
| E31 | 0 | 0 | 0 | 0 | ... |
| E30 | 0 | 0 | 0 | 0 | ... |
| E29 | 0 | 0 | 0 | 0 | ... |
| E28 | 0 | 0 | 0 | 0 | ... |
| E27 | 0 | 0 | 0 | 0 | ... |
| E26 | 0 | 0 | 0 | 0 | ... |
| E25 | 0 | 0 | 0 | 0 | ... |
| E24 | 0 | 0 | 0 | 0 | ... |
| E23 | 0 | 0 | 0 | 0 | ... |
| E22 | 0 | 0 | 0 | 0 | ... |
| E21 | 0 | 0 | 0 | 0 | ... |
| E20 | 0 | 0 | 0 | 0 | ... |
| E19 | 0 | 0 | 0 | 0 | ... |
| E18 | 0 | 0 | 0 | 0 | ... |
| E17 | 0 | 0 | 0 | 0 | ... |
| E16 | 0 | 0 | 1 | 1 | ... |
| E15 | 0 | 0 | 1 | 1 | ... |
| E14 | 0 | 0 | 1 | 1 | ... |
| E13 | 0 | 0 | 1 | 1 | ... |
| E12 | 0 | 0 | 1 | 1 | ... |
| E11 | 0 | 0 | 1 | 1 | ... |
| E10 | 0 | 0 | 1 | 1 | ... |
| E9 | 0 | 0 | 1 | 1 | ... |
| E8 | 0 | 0 | 1 | 1 | ... |
| E7 | 0 | 1 | 1 | 1 | ... |
| E6 | 0 | 1 | 1 | 1 | ... |
| E5 | 0 | 1 | 1 | 1 | ... |
| E4 | 0 | 1 | 1 | 1 | ... |
| E3 | 1 | 1 | 1 | 1 | ... |
| E2 | 1 | 1 | 1 | 1 | ... |
| E1 | 1 | 1 | 1 | 1 | ... |
| E0 | 1 | 1 | 1 | 1 | ... |

Fig. 5B

62 → DWA

| DI | 4 | 8 | 17 | 17 | ... |
|---|---|---|---|---|---|
| E31 | 0 | 0 | 0 | 1 | ... |
| E30 | 0 | 0 | 0 | 1 | ... |
| E29 | 0 | 0 | 0 | 1 | ... |
| E28 | 0 | 0 | 1 | 0 | ... |
| E27 | 0 | 0 | 1 | 0 | ... |
| E26 | 0 | 0 | 1 | 0 | ... |
| E25 | 0 | 0 | 1 | 0 | ... |
| E24 | 0 | 0 | 1 | 0 | ... |
| E23 | 0 | 0 | 1 | 0 | ... |
| E22 | 0 | 0 | 1 | 0 | ... |
| E21 | 0 | 0 | 1 | 0 | ... |
| E20 | 0 | 0 | 1 | 0 | ... |
| E19 | 0 | 0 | 1 | 0 | ... |
| E18 | 0 | 0 | 1 | 0 | ... |
| E17 | 0 | 0 | 1 | 0 | ... |
| E16 | 0 | 0 | 1 | 0 | ... |
| E15 | 0 | 0 | 1 | 0 | ... |
| E14 | 0 | 0 | 1 | 0 | ... |
| E13 | 0 | 0 | 1 | 1 | ... |
| E12 | 0 | 0 | 1 | 1 | ... |
| E11 | 0 | 1 | 0 | 1 | ... |
| E10 | 0 | 1 | 0 | 1 | ... |
| E9 | 0 | 1 | 0 | 1 | ... |
| E8 | 0 | 1 | 0 | 1 | ... |
| E7 | 0 | 1 | 0 | 1 | ... |
| E6 | 0 | 1 | 0 | 1 | ... |
| E5 | 0 | 1 | 0 | 1 | ... |
| E4 | 0 | 1 | 0 | 1 | ... |
| E3 | 1 | 0 | 0 | 1 | ... |
| E2 | 1 | 0 | 0 | 1 | ... |
| E1 | 1 | 0 | 0 | 1 | ... |
| E0 | 1 | 0 | 0 | 1 | ... |

Fig. 5C

64 → DPA

| Dither | 1 | 0 | 2 | 3 | ... |
|---|---|---|---|---|---|
| DI | 4 | 8 | 17 | 17 | ... |
| E31 | 0 | 0 | 0 | 0 | ... |
| E30 | 0 | 0 | 0 | 0 | ... |
| E29 | 0 | 0 | 1 | 0 | ... |
| E28 | 0 | 0 | 1 | 0 | ... |
| E27 | 0 | 0 | 1 | 0 | ... |
| E26 | 0 | 0 | 1 | 0 | ... |
| E25 | 0 | 0 | 1 | 0 | ... |
| E24 | 0 | 0 | 1 | 0 | ... |
| E23 | 0 | 0 | 1 | 0 | ... |
| E22 | 0 | 0 | 1 | 0 | ... |
| E21 | 0 | 0 | 1 | 0 | ... |
| E20 | 0 | 0 | 1 | 0 | ...* |
| E19 | 0 | 0 | 1 | 0 | ... |
| E18 | 0 | 0 | 1 | 0 | ... |
| E17 | 0 | 0 | 1 | 0 | ... |
| E16 | 0 | 0 | 1 | 1 | ... |
| E15 | 0 | 0 | 1 | 1 | ... |
| E14 | 0 | 0 | 1 | 1 | ... |
| E13 | 0 | 0 | 1* | 1 | ... |
| E12 | 0 | 1 | 0 | 1 | ... |
| E11 | 0 | 1 | 0 | 1 | ... |
| E10 | 0 | 1 | 0 | 1 | ... |
| E9 | 0 | 1 | 0 | 1 | ... |
| E8 | 0 | 1 | 0 | 1 | ... |
| E7 | 0 | 1 | 0 | 1 | ... |
| E6 | 0 | 1 | 0 | 1 | ... |
| E5 | 0 | 1* | 0 | 1 | ... |
| E4 | 0 | 0 | 0 | 1 | ... |
| E3 | 1 | 0 | 0 | 1 | ... |
| E2 | 1 | 0 | 0 | 1 | ... |
| E1 | 1 | 0 | 0 | 1 | ... |
| E0 | 1* | 0 | 0 | 1* | ... |

…

SYSTEM AND METHOD FOR DYNAMIC ELEMENT MATCHING

FIELD OF INVENTION

The present invention relates generally to integrated circuit devices and more particularly to systems and methods for dynamic element matching in data converters, such as digital-to-analog converters.

BACKGROUND OF THE INVENTION

Sigma delta modulators (SDMs) are devices used in data converters, such as analog-to-digital (A/D) converters, where the SDM performs noise shaping functions. SDMs may be first order, second order, or jth order, where j is a positive integer. For example, a typical first order sigma delta modulator comprises a filter, such as an integrator circuit, which receives an analog input signal as well as a feedback signal, and a quantizer, such as a flash A/D converter, which quantizes the filter output signal to create a digital output. In the simplest form, the quantizer may be a single bit A/D, such as a comparator circuit. A digital to analog (D/A) converter creates an analog representation of the current digital output and provides this as an analog feedback signal to the filter. Multiple order sigma delta modulators may include a series of n filters in a forward path, each filtering the output of the previous filter and receiving an analog feedback signal based on the digitized output of the modulator, where the first filter operates on the analog input signal to be converted and the feedback signal. Multi-bit or multi-level sigma delta modulators provide multi-bit digital or quantized outputs, wherein the analog to digital converter provides a multi-bit digital output representative of the input signal. In this case, the feedback D/A converter is a multi-bit converter as well.

Whereas single-bit sigma delta modulators can achieve good linearity, linearity performance and stability are generally not as good as in multi-bit sigma delta modulators. In this regard, the linearity of a multi-bit SDM is essentially limited by the linearity of the D/A converter, particularly nonlinearity due to mismatch of D/A internal components, which causes a distortion in the modulator. This distortion is typically found as harmonics of the input signal, which is a serious problem for some applications, such as audio data conversion. One approach for dealing with the non-linearity problems for multi-bit data converters involves dynamic element matching (DEM), which operates to transform the non-linearity error caused by D/A element mismatch into random noise, in combination with noise-shaping by changing the bit pattern of data such that most of the noise falls outside the signal band of interest. This out-of-band noise can then be filtered out, such as by decimation filtering. In general, the D/A element mismatch is thus converted from a static error into a wide-bandwidth noise by selecting different D/A elements to represent a digital input code at different times. Such DEM techniques may be employed in an SDM feedback path to vary the selection of mismatched components in the D/A converter in response to the quantized (e.g., digital input) signal.

Data Weighted Averaging (DWA) is one of the conventional DEM algorithms and has been widely used. However, DWA algorithms suffer from the production of unintended tone components in the output, sometimes referred to as idle channel tones. This problem is particularly troublesome for static (e.g., DC) or slowly changing input signals, and/or for low oversampling ratios (e.g., less than or equal to 8), wherein the modulator creates a repetitive pattern, which appears as a tonal component in the output spectrum. This degrades usable system range, sometimes measured as Spurious Free Dynamic Range (SFDR). Accordingly, there is a need for improved D/A converters and DEM systems therefor, as well as methods by which tones are dispersed and SFDR is improved in systems employing D/A converters with mismatched circuit elements.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The invention relates to systems and methods for dynamic element matching (DEM) in which D/A converter elements are selected according to a DEM code and a digital input code, where a current DEM code is generated according to a previous DEM code, the digital input code, and a dither code.

One aspect of the invention provides a DEM system for selecting D/A converter elements according to a digital input code, which comprises a dither system generating a dither code and a DEM code system generating a current DEM code according to a previous DEM code, the dither code, and the digital input code. A switching system is provided, which generates select signals for selecting D/A elements according to the digital input code and one of the current DEM code and the previous DEM code. In one example, the switching system comprises a barrel shifter circuit, and the dither system generates the dither code as a pseudo-random code, as a code representative of quantization noise associated with a quantizer, or as a code representative of a non-zero constant value.

The DEM code system may comprise an adder circuit which sums the dither code and the digital input code to generate an intermediate sum code, as well as an accumulator which sums the intermediate sum code and the previous DEM code to generate the current DEM code. In one implementation, the adder may be configured to selectively sum the dither code with the digital input code or to set the intermediate sum code to be equal to the digital input code according to a cycle status associated with the previous DEM code. For example, the DEM code system may comprise a cycle detector circuit receiving the previous DEM code and providing a corresponding cycle status signal, as well as a gate circuit receiving the cycle status signal and the dither code, which selectively provides the dither code to the adder circuit according to the cycle status signal.

Another aspect of the invention provides a sigma delta modulator, comprising one or more filters receiving an input signal and an analog feedback signal, which provides a filtered output signal, as well as a quantizer that provides a quantized output signal according to the filtered output signal. A D/A converter receives the quantized output signal as a digital input code and provides an analog feedback signal, using D/A elements selected according to the quantized output signal. The modulator also comprises a DEM system comprising a dither system to generate a dither code and a DEM code system to generate a current DEM code according to a previous DEM code, the dither code, and the quantized output signal. The DEM system also comprises a switching system, which generates select signals for selecting D/A elements according to the quantized output signal and one of the current DEM code and the previous DEM code.

Yet another aspect of the invention provides data conversion systems, such as A/D, D/A, or other converters, including one or more D/A converters comprising a plurality of selectable D/A elements, and a DEM system for varying the selection of D/A elements of the D/A converter. The DEM system comprises a dither system generating a dither code, a DEM code system generating a current DEM code according to a previous DEM code, the dither code, and the digital input code, and a switching system generating select signals for selecting D/A elements according to the digital input code and one of the current DEM code and the previous DEM code.

Still another aspect of the invention provides a method for selecting D/A converter elements according to a digital input code. The method comprises receiving a digital input code, generating a dither code, generating a current DEM code according to a previous DEM code, the dither code, and the digital input code, and selecting D/A elements according to the digital input code and one of the current DEM code and the previous DEM code. In one implementation, the method further comprises converting the digital input code to a binary input code, wherein the current DEM code is generated according to the previous DEM code, the dither code, and the binary input code. The dither code may be generated as a pseudo-random code, as a code representative of quantization noise associated with a quantizer, or as a code representative of a non-zero constant value.

Generation of the current DEM code may involve determining a cycle status associated with the previous DEM code, selectively summing the dither code and the digital input code to generate an intermediate sum code according to the cycle status, and summing the intermediate sum code and the previous DEM code to generate the current DEM code. In this example, selectively summing the dither code and the digital input code may comprise summing the dither code and the digital input code to generate the intermediate sum code if the cycle status is a first status, and setting the intermediate sum code equal to the digital input code if the cycle status is not the first status.

The following description and annexed drawings set forth in detail certain illustrative aspects and implementations of the invention. These are indicative of but a few of the various ways in which the principles of the invention may be employed.

BRIEF DESCRIPTION OF THE DRAWINGS

FIG. 4B is a truth table illustrating operation of an exemplary barrel shifter type switching system in the exemplary DEM system of FIG. 4A;

FIG. 5A is a table illustrating D/A element selection in a modulator employing no dynamic element matching;

FIG. 5B is a table illustrating D/A element selection in a modulator employing DWA type dynamic element matching;

FIG. 5C is a table illustrating D/A element selection in a modulator employing dither pointer averaging type dynamic element matching in accordance with the present invention;

DETAILED DESCRIPTION OF THE INVENTION

Figure 1:
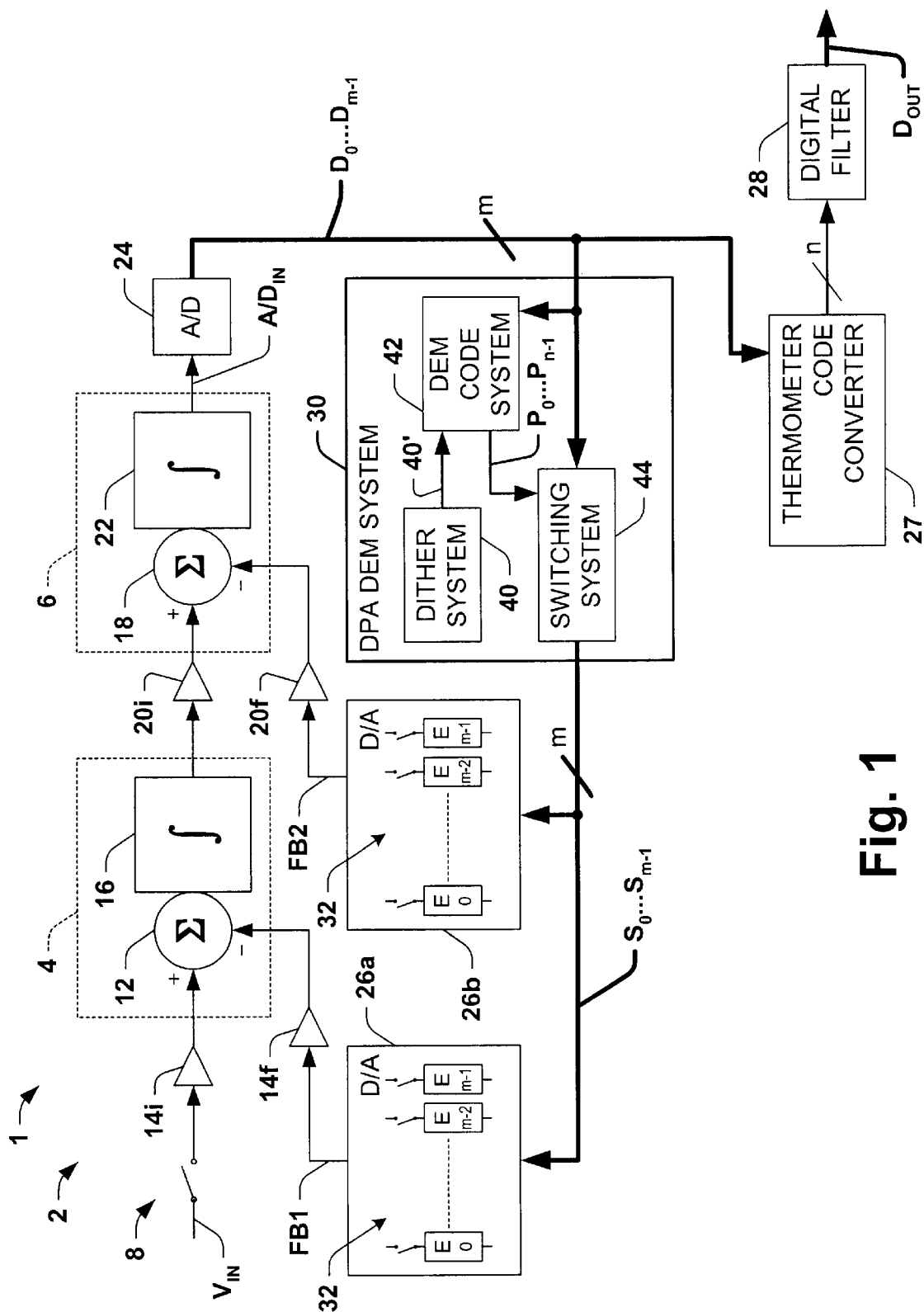
FIG. 1 is a schematic diagram illustrating an exemplary analog-to-digital converter comprising a second order multi-bit sigma delta modulator having a dynamic element matching system for selection of D/A converter elements in accordance with one or more aspects of the present invention.

One or more exemplary implementations of the present invention will now be described with reference to the attached drawings, wherein like reference numerals are used to refer to like elements throughout. The invention relates to dynamic element matching in D/A converters, which may be employed in any conversion system, such as sigma delta modulators (SDMs) and digital to analog converters therefore. For example, the various aspects of the invention may be employed in A/D converters comprising a D/A feedback converter, D/A converter systems employing SDMs, or any system in which dynamic element matching is desired for selection of elements in a D/A converter. The invention is hereinafter illustrated and described in the context of A/D conversion systems comprising sigma delta modulators having one or more feedback D/A converters. However, the invention is not limited to the illustrated implementations.

Figure 2:
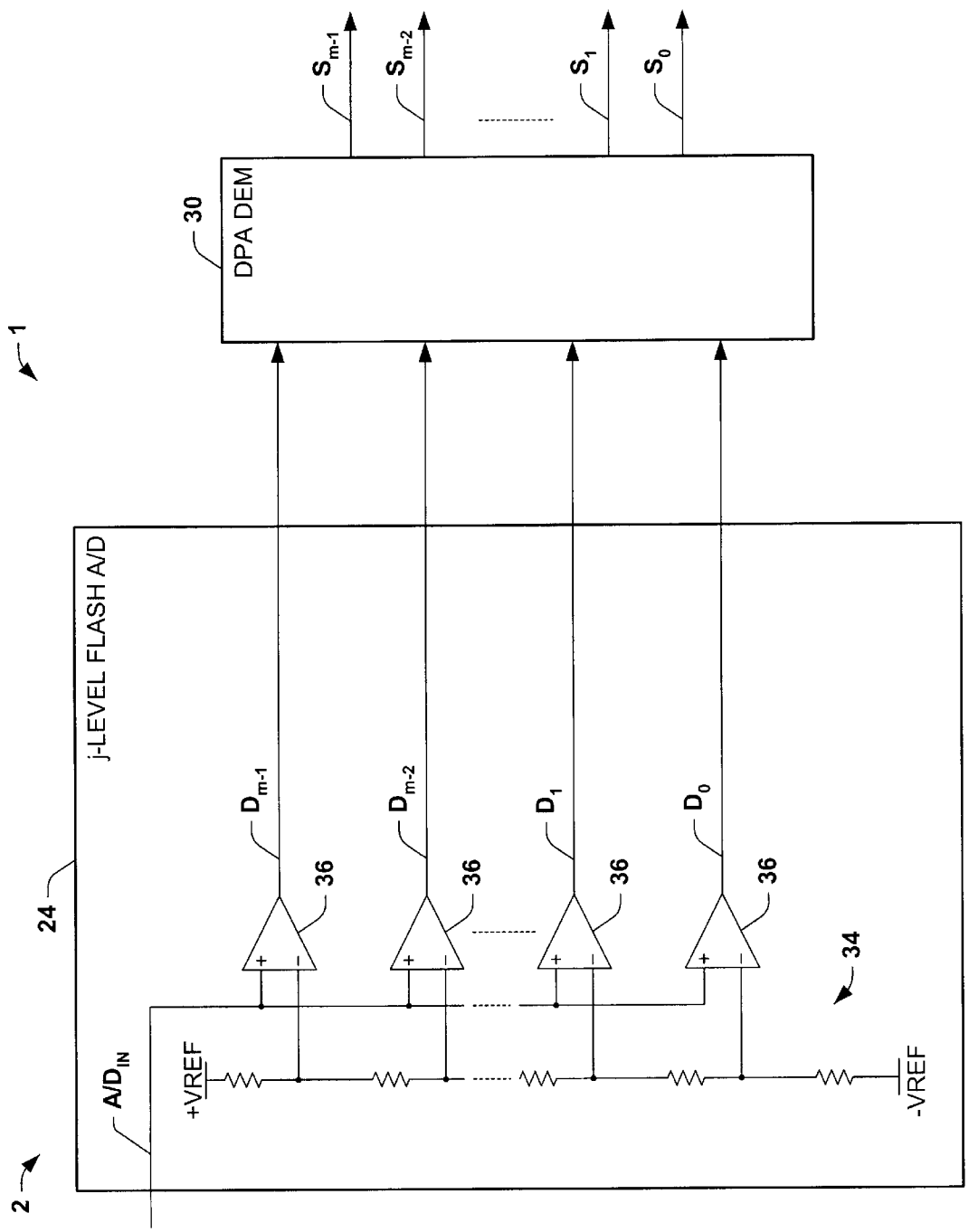
FIG. 2 is a schematic diagram illustrating further details of an exemplary multi-level A/D converter and the dynamic element matching system in the exemplary modulator of FIG. 1.
Figure 3:
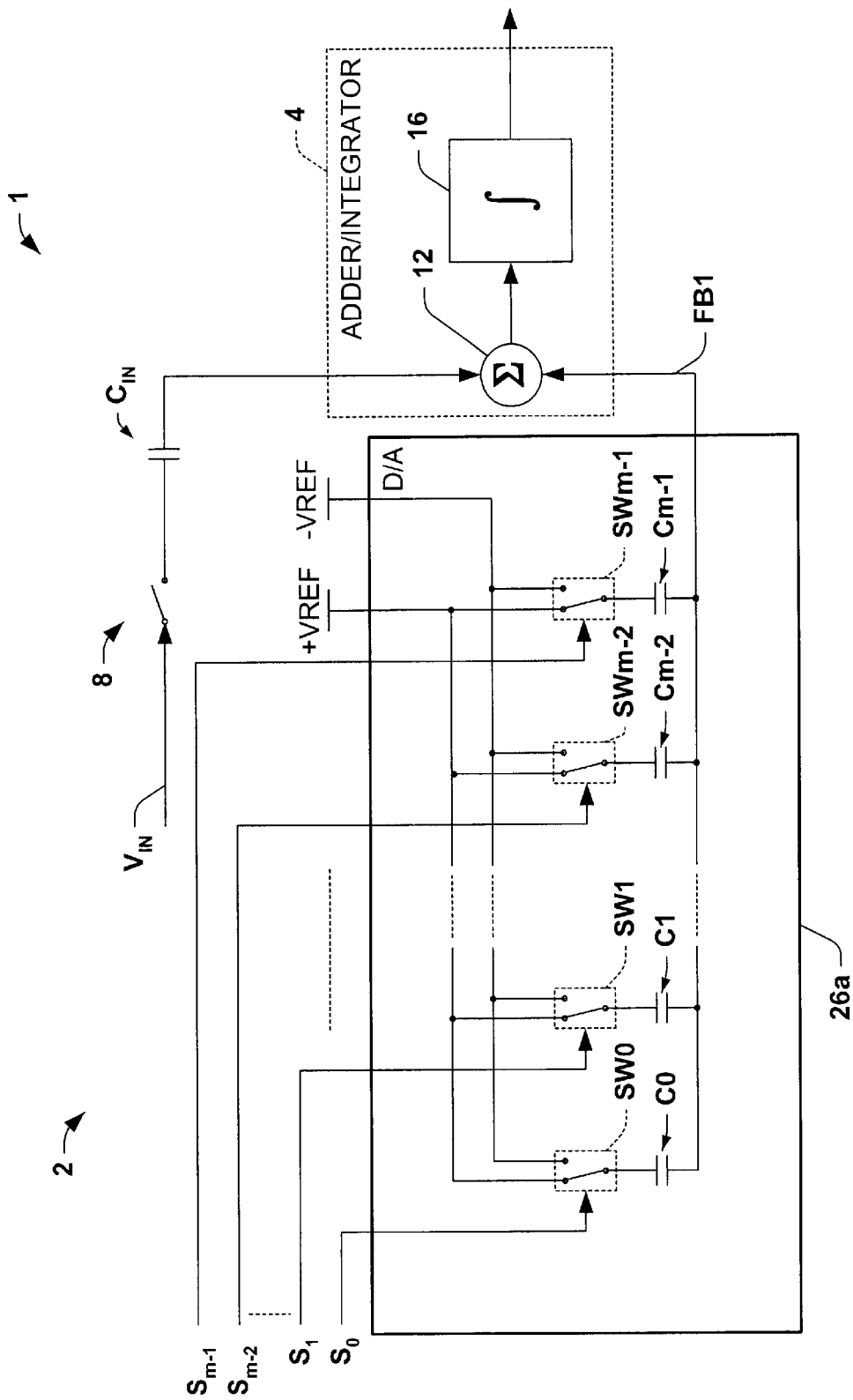
FIG. 3 is a schematic diagram illustrating further details of one of the D/A converters in the exemplary modulator of FIG. 1.

Referring initially to FIGS. 1–3, an exemplary A/D converter 1 is illustrated in FIG. 1 comprising a second order sigma delta modulator (SDM) 2 with a dither pointer averaging (DPA) type DEM system 30 in accordance with one or more aspects of the present invention. The modulator 2 comprises first and second adder/integrators 4 and 6, respectively, wherein the first adder/integrator 4 comprises a summing junction 12 and a filter 16, such as a switched capacitor integrator circuit. The summing junction 12 receives an analog input signal $V_{IN}$ via an input gain stage 14$i$ and a feedback signal FB1 via a feedback gain stage 14$f$ from a first D/A converter 26a, as described further below. The summing junction 12 provides an error signal to the input of the first filter 16. The SDM 2 may be a continuous time modulator or the input signal $V_{IN}$ may be periodically sampled via a switching element 8. The integrator filter 16 provides a filtered output through a second input gain stage 20i to a summing junction 18 of the second adder/integrator 6, which also receives a second feedback signal FB2 via a second feedback gain stage 20f from a second D/A converter 26b generally similar to the first D/A converter 26a. The summing junction 18 provides an error signal to the input of a second integrator filter 22.

Referring also to FIG. 2, the SDM 2 further comprises an analog to digital (A/D) converter or quantizer 24 receiving the resultant signal $A/D_{IN}$ from the second filter 22, which generates a quantized or digital output signal $D_0 \ldots D_{m-1}$, where m is a positive integer. In the illustrated example, the quantizer 24 is a 33-level flash A/D converter generating a 32-bit thermometer coded quantized output (e.g., m=32 in the illustrated example), although any multi-bit A/D converter or quantizer may be used. A thermometer code converter 27 converts the 32 bit thermometer coded quantized output $D_0 \ldots D_{m-1}$ to an 'n'-bit binary code (e.g., n=5 in this example), and provides the binary output to a digital decimation filter 28, which reduces undesirable noise therein. The digital filter 28 acts as an anti-aliasing filter with respect to the final sampling rate and filters out higher frequency noise produced by the noise shaping process of the modulator 2. Final data reduction is performed by digitally resampling the filtered output at a lower rate using a process called decimation in the filter 28, wherein decimation removes redundant signal information introduced by the oversampling process.

The filters 16 and 22 and the quantizer 24 may be of any form suitable for use in constructing sigma delta modulators, for example, such as switched capacitor integrator filters 16, 22 and a multi-level (e.g., multi-bit) flash or other type A/D converter 24, respectively. FIG. 2 illustrates further details of the exemplary quantizer 24, which comprises a j-level flash A/D converter 24 receiving the analog output signal $A/D_{IN}$ from the second filter 22, wherein j=33 in the illustrated example. The converter 24 generates 32 thermometer coded output signals $D_0 \ldots D_{m-1}$ corresponding to the $A/D_{IN}$ signal using a resistive divider network 34 and comparator circuits 36. In this example, signals $D_0 \ldots D_{m-1}$ provide a thermometer code representation of 33 levels between a negative reference voltage −VREF and a positive reference voltage +VREF. Alternatively, any suitable A/D converter may be employed to receive the filtered output of the final filter or integrator in the modulator forward path, which provides a multi-bit quantized signal representative of the input signal $V_{IN}$. Further, the conversion of the thermometer code to the digital output may alternatively be performed in the A/D converter 24.

Referring also to FIG. 3, the D/A converters 26a and 26b individually comprise a plurality 32 of circuit elements E having an associated element value. The D/A converters 26a and 26b provide the analog feedback signals FB1 and FB2, respectively, corresponding to the quantized output signal $D_0 \ldots D_{m-1}$ using circuit elements E selected according to DEM select output signals $S_0 \ldots S_{m-1}$ from the DEM system 30 in accordance with the invention. The D/A circuit elements E may be any form of component used in creation of the feedback analog signal FB1 through component selection. For example, the circuit elements of the present invention may comprise capacitors, resistive elements, current source circuits, or other D/A circuit elements, including single components or groups of components. The element values, moreover, may be any value affecting D/A conversion, such as capacitance, resistance, transistor size, gain, etc.

FIG. 3 illustrates an exemplary implementation of the first D/A converter 26a providing the feedback signal FB1 to the first adder/integrator 4. The exemplary D/A converter 26a is a switched capacitor converter, comprising D/A capacitor elements C1 through Cm−1 and switching elements SW1 through SWm−1 for selectively coupling the capacitors C1 through Cm−1 with a positive reference voltage +VREF or a negative reference voltage −VREF according to the switching selection signals $S_0 \ldots S_{m-1}$ from the DPA DEM system 30. The charge on these capacitances is then summed at the summing junction 12 with the charge corresponding to the sampled input voltage $V_{IN}$, wherein the relative input and feedback gains (e.g., gain stages 14i and 14f in FIG. 1) are established in the present example according to the relative values of an input capacitance $C_{IN}$ and the D/A capacitances C1–C4. The resulting charge is an error signal and is then provided to the integrator filter 16.

In the illustrated example, the feedback signal FB1 is inverted by action of the switching signals $S_0 \ldots S_{m-1}$, so as to achieve negative feedback in the modulator 2. Where the quantized output $D_0 \ldots D_{m-1}$ represents a full-scale positive voltage, for example, the switching signals $S_0 \ldots S_{m-1}$ cause all the capacitors C1 through Cm−1 to be coupled with −VREF, whereby a negative full-scale feedback signal FB1 is created. Where the quantized output represents zero volts (e.g., midway between −VREF and +VREF), the switching signals $S_0 \ldots S_{m-1}$ provide for coupling half of the capacitors C1 through Cm−1 with −VREF and the remaining capacitors with +VREF. For a full-scale negative voltage, the switching signals $S_0 \ldots S_{m-1}$ cause all the D/A capacitors to be coupled with +VREF, whereby a positive full-scale feedback signal FB1 is created. In this regard, the DEM system 30 provides for variation of the selection of the capacitors C1 through Cm−1, such that the same capacitors are not necessarily switching in the same fashion for two occurrences of the same digital output value.

Although the exemplary sigma delta modulator 2 is a second order design, the invention is applicable to sigma delta modulators of any order and D/A converters therefor, wherein the modulator may be of any order, such as first order, second order, or ith order, where i is a positive integer. An exemplary first order modulator may be constructed, for example, wherein the filtered output of the first filter 16 is provided to the A/D converter 24 as an input $A/D_{IN}$, and wherein the items 6, 18, 20i, 20f, 22, and 26b are omitted in FIG. 1. In general, multiple order modulators in accordance with the invention may comprise a plurality of filters serially coupled between the input signal $V_{IN}$ and the quantizer 24, and a plurality of D/A converters 26, with individual D/As 26 being coupled with the quantizer 24, the DEM system 30, and a corresponding one of the plurality of filters. Alternatively, a single D/A converter 26 operated according to the DEM features of the invention may provide multiple feedback signals in a multiple order sigma delta modulator.

The exemplary DEM system 30 comprises a dither system 40, a DEM code system 42, and a switching system 44, implementing a DEM technique referred to herein as Dither Pointer Averaging (DPA). In operation, the exemplary DPA DEM system 30 receives the quantized output signal $D_0 \ldots D_{m-1}$ as a digital input code and provides switching selection signals $S_0 \ldots S_{m-1}$ in accordance with the digital input code $D_0 \ldots D_{m-1}$ and a DEM code. The DEM system 30 is thus coupled between the D/A converters 26a and 26b and the quantizer 24, and operates to vary the selection of the D/A elements E of the D/A converters 26a and 26b by generating the switching selection signals $S_0 \ldots S_{m-1}$. The dither system 40 generates a dither code 40', such as a pseudo-random code, a code representative of quantization noise associated with the quantizer 24, a code representative of a non-zero constant value, or other dither code. The DEM code system 42 receives the dither code 40' and the digital input code $D_0 \ldots D_{m-1}$ and generates a current DEM code, such as an n-bit binary pointer code $P_0 \ldots P_{n-1}$ according to a previous DEM code, the dither code 40', and the digital input code $D_0 \ldots D_{m-1}$. The switching system 44 receives the digital input code $D_0 \ldots D_{m-1}$ and the current DEM code $P_0 \ldots P_{n-1}$ and generates the select signals $S_0 \ldots S_{m-1}$ for selecting D/A elements E according to the digital input code $D_0 \ldots D_{m-1}$ and the current or previous DEM code $P_0 \ldots P_{n-1}$.

Figure 4A:
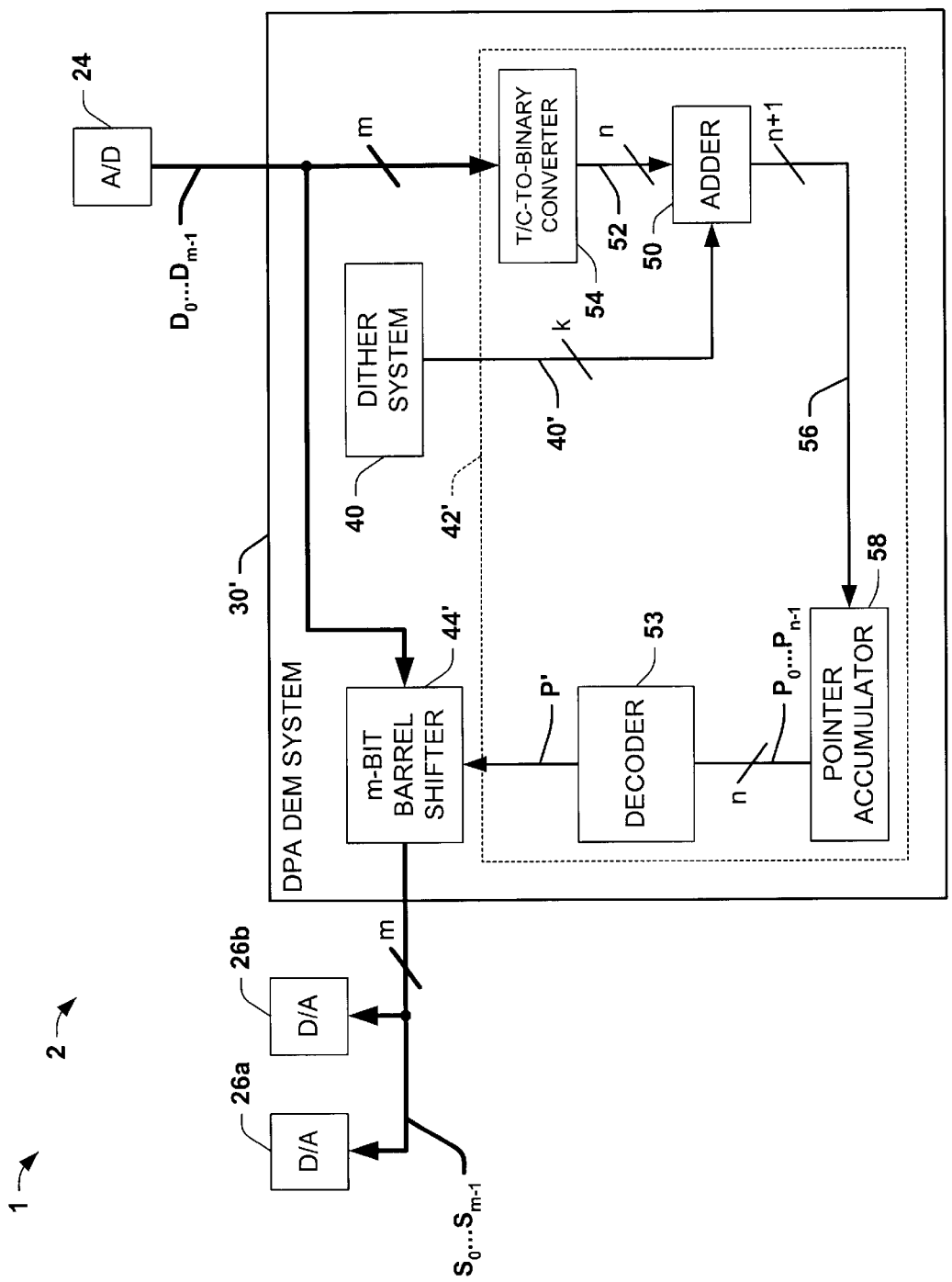
FIG. 4A is a schematic diagram illustrating one exemplary dynamic element matching system in accordance with the invention.
Figure 4B:
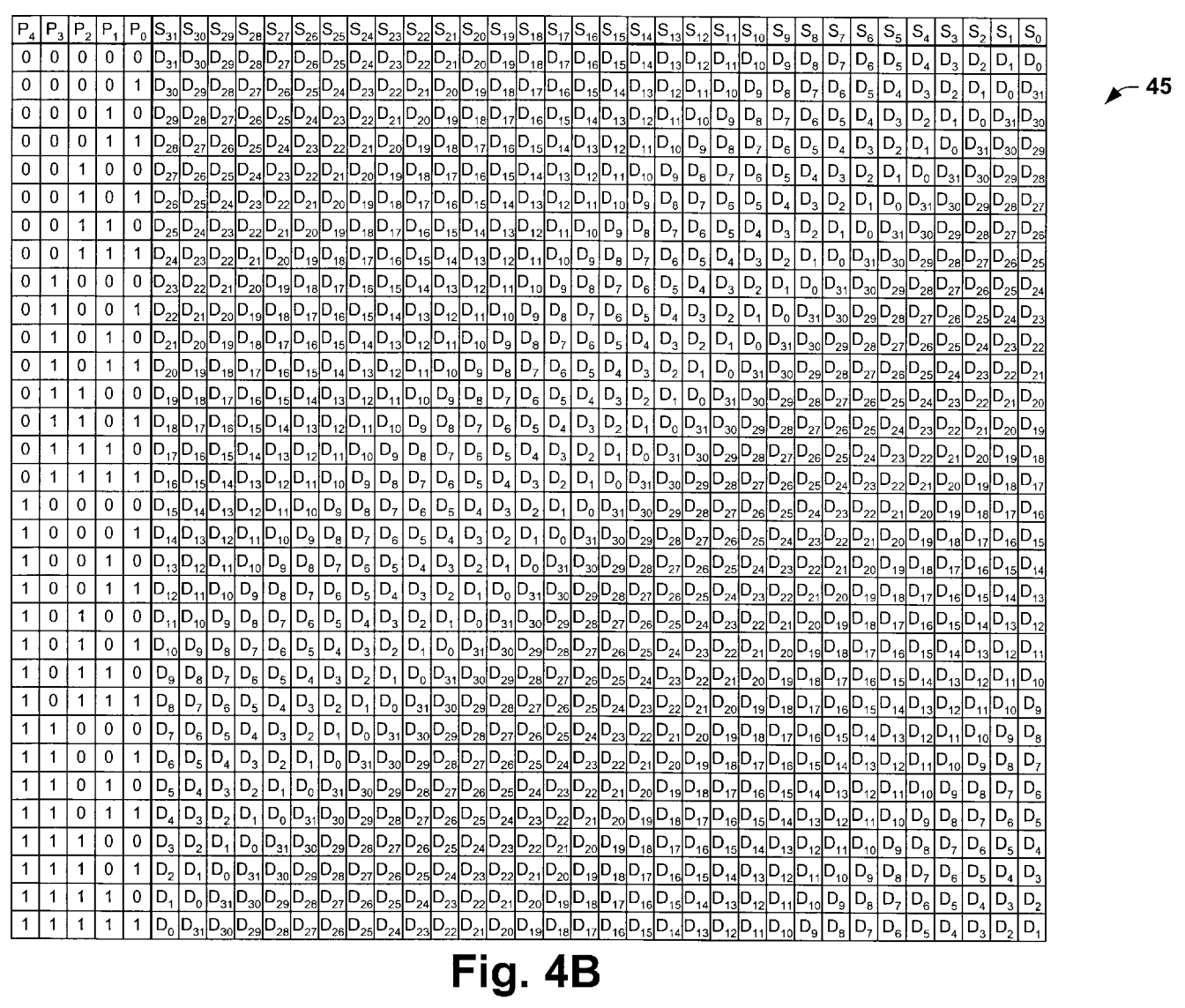
Figure 4C:
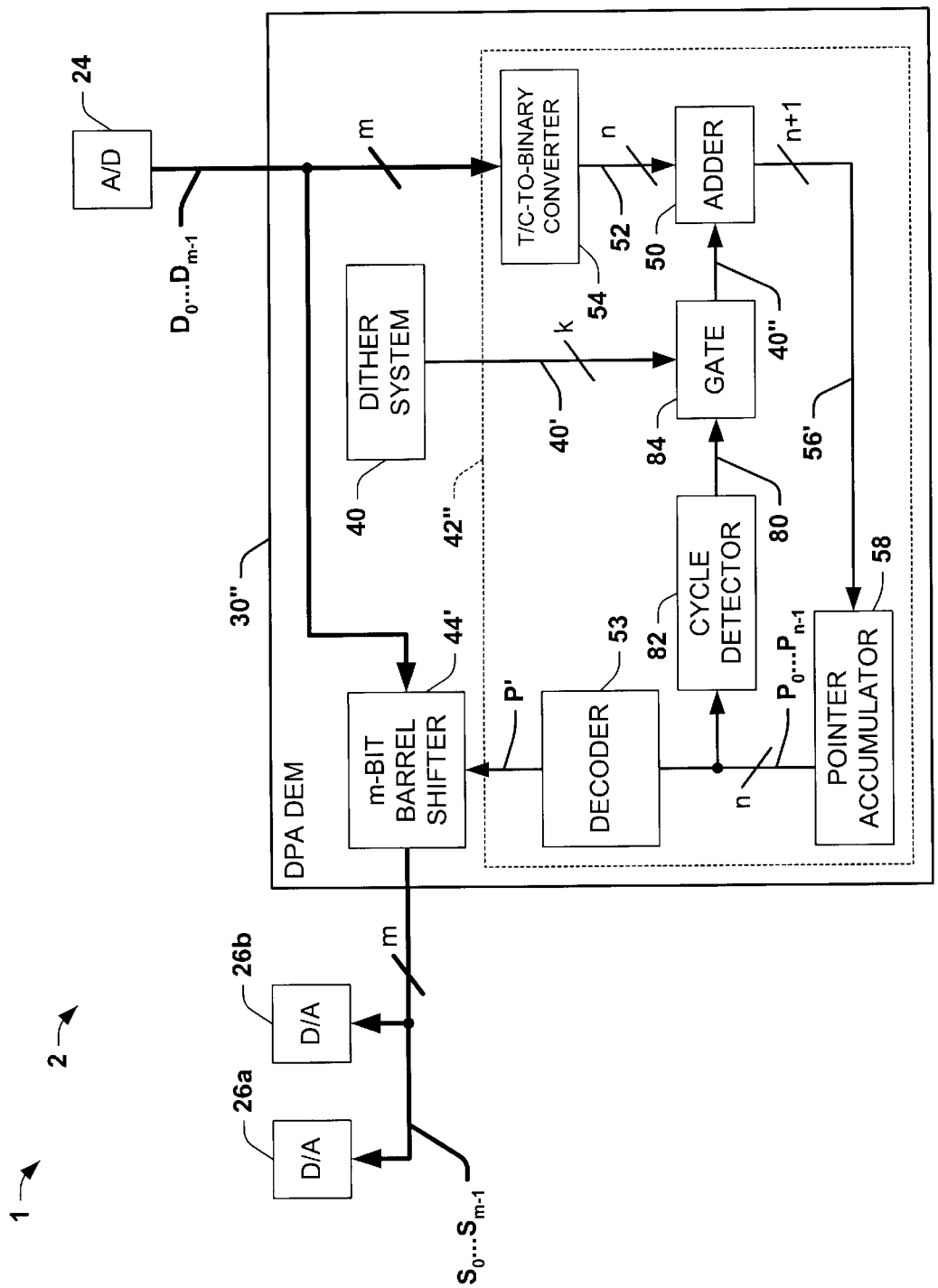
FIG. 4C is a schematic diagram illustrating another exemplary dynamic element matching system in accordance with the invention.

FIGS. 4A and 4C illustrate two possible implementations of the DPA DEM system 30 in accordance with the invention. In FIG. 4A, an exemplary DPA DEM system 30' is illustrated, comprising a dither system 40, a DEM code system 42', and a switching system 44'. The switching system 44' comprises a barrel shifter circuit having a plurality of signal inputs receiving the m-bit digital input code $D_0 \ldots D_{m-1}$ (thermometer code in this implementation) from the quantizer 24 and a plurality of control inputs receiving an n-bit binary DEM code $P_0 \ldots P_{n-1}$ or a decoded set of control inputs P' based on the binary DEM code $P_0 \ldots P_{n-1}$ from the DEM code system 42', wherein the inputs P' comprise a plurality of signals wherein only one bit is "1" at a given time in one implementation of the invention. The switching system 44' further comprises a plurality of outputs providing the digital input code $D_0 \ldots D_{m-1}$ as select signals $S_0 \ldots S_{m-1}$ for selecting the elements in the D/A converters 26a and 26b. The exemplary barrel shifter circuit 44' generates the output select signals $S_0 \ldots S_{m-1}$ by shifting the input code $D_0 \ldots D_{m-1}$ according to the current or previous binary pointer code $P_0 \ldots P_{n-1}$ (e.g., FIG. 4B illustrates a truth table 45 for the exemplary barrel shifter circuit 44', wherein the circuit 44' includes appropriate multiplexer or other type circuitry (not shown) for implementing the truth table 45.

Other switching systems 44 are possible within the scope of the invention, which generate select signals (e.g., signals $S_0 \ldots S_{m-1}$) according to a digital input code (e.g., $D_0 \ldots D_{m-1}$) and a DEM code (e.g., P', $P_0 \ldots P_{n-1}$, etc.). The switching system 44 may be constructed to implement such functionality regardless of the code types of the input code, the DEM code, and the select signals. Thus, the exemplary barrel shifter 44' receives the digital input code $D_0 \ldots D_{m-1}$ in the form of a thermometer code, and selectively shifts these signals to provide a characteristic code output comprising select signals $S_0 \ldots S_{m-1}$ based on the value of the binary coded DEM pointer code $P_0 \ldots P_{n-1}$. However, the barrel shifter 44' is but one example, wherein the invention and the appended claims are not limited to the illustrated implementations. In this regard, the digital input code $D_0 \ldots D_{m-1}$, the dither code 40' and the select signals $S_0 \ldots S_{m-1}$ may be in thermometer code, binary code, or any coding type or format, of any size (e.g., number of bits or signals) within the scope of the invention. Accordingly, the circuitry or components of the DEM system 30 may be appropriately designed to implement the functions illustrated and described herein regardless of the particular data formats, for example, by provision of suitable conversion circuitry, or by other design techniques. In the DEM system 30' of FIGS. 4A and 4B, the digital input code $D_0 \ldots D_{m-1}$ and the select signals $S_0 \ldots S_{m-1}$ are m-bit thermometer codes (e.g., m=32 in this example), the dither code 40' is a k-bit binary code (e.g., k=5 in this example), and the DEM pointer code $P_0 \ldots P_{n-1}$ is an n-bit binary code (e.g., n=5 in this example). In this case, the value of the DEM pointer code $P_0 \ldots P_{n-1}$ determines the number of positions by which the digital input code $D_0 \ldots D_{m-1}$ is shifted in generating the switching select signals $S_0 \ldots S_{m-1}$ in the barrel shifter 44', as illustrated in the table 45.

In accordance with an aspect of the invention, the DEM code system 42' receives the dither code 40' and the digital input code $D_0 \ldots D_{m-1}$ and generates a current pointer code $P_0 \ldots P_{n-1}$ (DEM code) according to a previous pointer code, the dither code 40', and the digital input code $D_0 \ldots D_{m-1}$. The current pointer code $P_0 \ldots P_{n-1}$ is then provided directly or indirectly (e.g., as decoded signals P') through a decoder 53 as control or select inputs to the barrel shifter 44' for the next data input. The DEM code system 42' comprises an adder circuit 50 receiving the k-bit binary dither code 40' from the dither system 40, which may be generated as a pseudo-random code, as a code representative of quantization noise associated with the quantizer 24, or as a code representative of a non-zero constant value. The thermometer coded digital input $D_0 \ldots D_{m-1}$ is converted to an n-bit binary input code 52 via a thermometer-to-binary converter circuit 54. The adder 50 thus receives the binary dither code 40' and the binary input code 52 and sums these to generate an n+1 bit binary intermediate sum code 56. The DEM code system 42' further comprises an accumulator 58 receiving the intermediate sum code 56, which sums this with a previous pointer code to generate the current pointer code (the current DEM code) $P_0 \ldots P_{n-1}$. In this implementation, the accumulator 58 includes wrap-around circuitry to receive the n+1 bit intermediate code 56 and to generate the n-bit pointer code $P_0 \ldots P_{n-1}$.

Referring also to FIGS. 5A–5C, exemplary D/A element selection tables 60, 62, and 64 are illustrated for sequentially occurring digital input values of 4, 8, 17, and 17 in the case of no dynamic element matching, DWA type dynamic element matching, and DPA dynamic element matching per the present invention, respectively. In the table 60 of FIG. 5A, the element selection is based solely on the digital input (DI), for example, wherein the quantized thermometer code output $D_0 \ldots D_{m-1}$ from the A/D converter 24 is provided directly to the D/A converters 26a and 26b as select inputs. In the table 62 of FIG. 5B, data weighted averaging is used, wherein the current element selection is based solely on the prior selection and the input data.

The table 64 in FIG. 5C illustrates operation of the exemplary DEM system 30' of FIG. 4A for this data stream (4, 8, 17, and 17), with corresponding dither code values (1, 0, 2, and 3). Assuming an initial pointer value (e.g., the value of the DEM code $P_0 \ldots P_{n-1}$) of zero (indicated by an asterisk in the table 5C), the first thermometer code input value (e.g., the value of digital input code $D_0 \ldots D_{m-1}$) is 4, wherein the barrel shifter provides no shifting, and the first four D/A elements E0–E3 are selected. The dither system 40 provides a binary dither code 40' of value 1 (e.g., 0001), and the thermometer code converter 54 provides a 5-bit binary representation of the input value 4 (e.g., 00100) to the adder 50. The adder 50 sums these binary codes and provides the intermediate sum code 56 as a 5-bit binary representation of the value 5 (e.g., 00101), which is then summed with the previous pointer value (e.g., 0), whereby the current pointer is set to 5 (e.g., element E5 will be the next element selected. Accordingly, when the next digital input value (e.g., 8) is presented to the barrel shifter 44', elements E5 through E12 are selected, and the pointer is updated to element E13 (e.g., the value of the pointer code $P_0 \ldots P_{n-1}$ is 13). In the next data conversion, the input value 17 is presented to the shifter 44', and shifted by 13, wherein elements E13–E29 are selected, and the pointer value is updated to 32, which wraps around to a value of zero. The next data input value is 17, resulting in selection of elements E0–E16, where the dither input value of 3, causing the pointer value to become 20 for the next digital input code value (not shown).

The exemplary DEM system 30' thus provides the pointer DEM code $P_0 \ldots P_{n-1}$ according to a previous DEM code, the dither code, and the digital input code, where the previous pointer code is used to shift the current data before the pointer accumulator is updated. Other implementations are possible within the scope of the invention wherein the DEM code is updated based on current or previous dither codes, previous or current digital input codes, before or after being employed by the switching system 44 to generate the select signals for selecting D/A elements.

Figure 6:
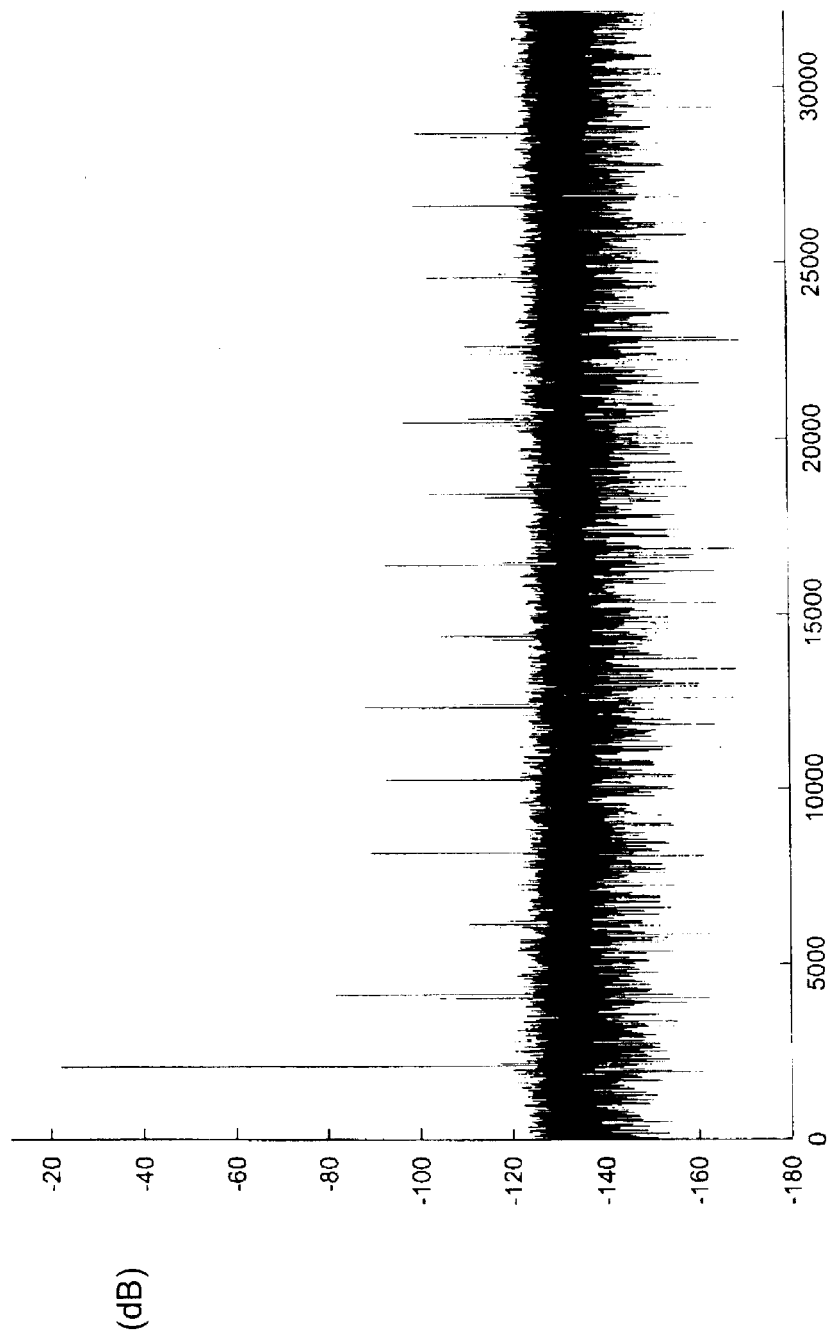
FIG. 6 is a plot illustrating a second order SDM output spectrum for a single input tone using no dynamic element matching.
Figure 7:
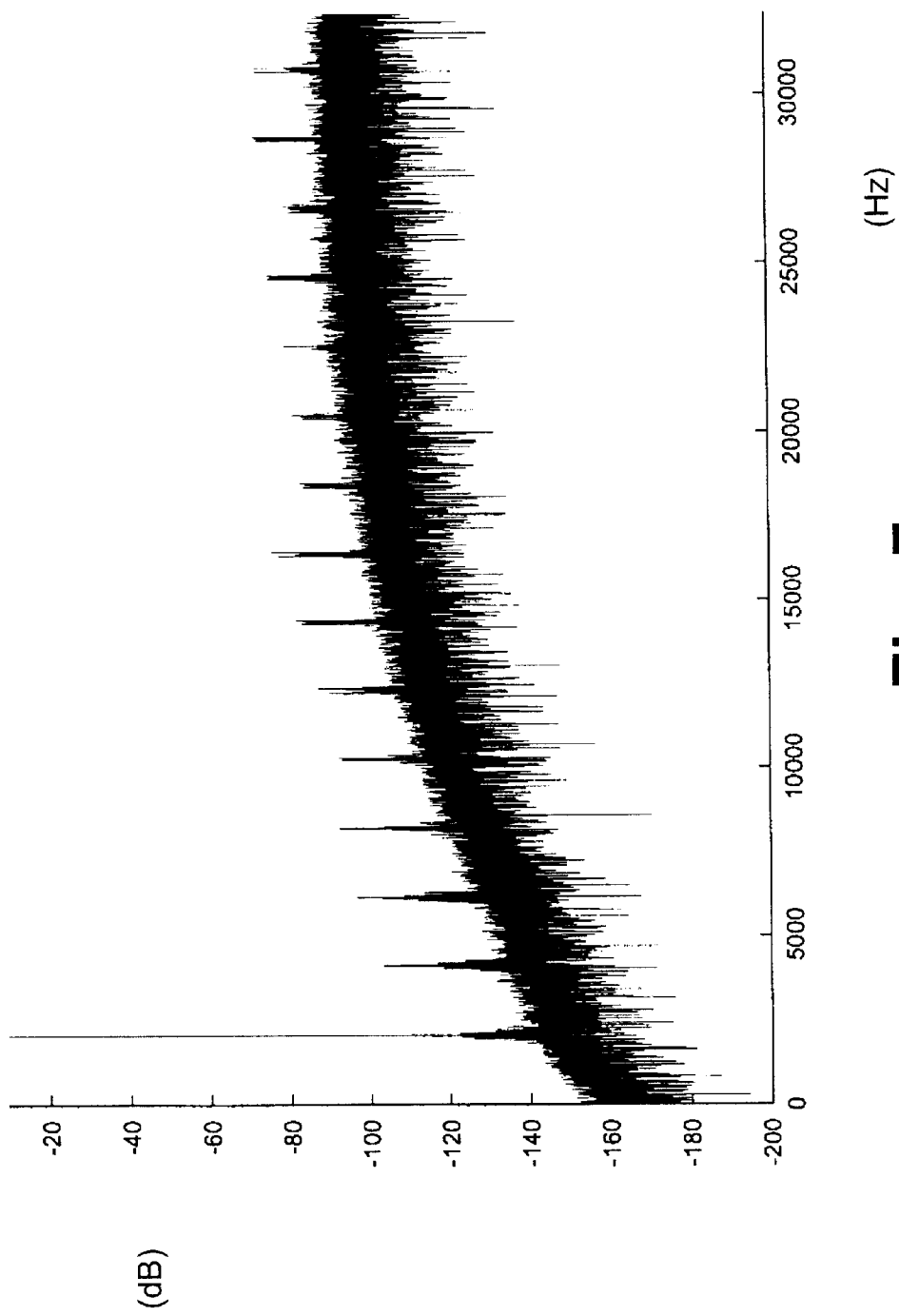
FIG. 7 is a plot illustrating a second order SDM output spectrum for a single input tone employing DWA type dynamic element matching.

Referring also to FIGS. 6–10, the inventor has appreciated that if no dynamic element matching is used, element mismatch in a D/A converter causes generation of harmonic distortion components in the D/A output, resulting in limitation or reduction in the spurious free dynamic range (SFDR) of the converter. In the case of a D/A converter (e.g., converter 26a) employed in a feedback path of a sigma-delta modulator-base A/D converter system, distortion in the analog feedback signal (e.g., FB1 in FIG. 1), results in reduced performance of the entire modulator. In FIG. 6, a plot 70 is provided, illustrating a second order SDM output spectrum as a function of frequency for a single input tone of about 2000 Hz at −1 dB using no dynamic element matching. In the simulated results of FIGS. 6–10, a 5-bit D/A converter is used, having 32 elements with a mismatch of 0.1% rms from element to element, providing 33 D/A output levels, wherein 65,536 samples were used for FFT analysis. As can be seen in the plot 70 of FIG. 6, distortion occurs at harmonics of the tone frequency, resulting in SFDR being limited to about 80 dB. FIG. 7 illustrates a plot 72 of the SDM output spectrum for the single tone input, wherein DWA type dynamic element matching is used. In this example, the harmonic distortions are somewhat suppressed at lower frequencies, which yields an SFDR of 102.5 dB at an over-sampling rate (OSR) of 8 or an SFDR of 91 dB at an OSR of 4. However, it is noted in the plot 72 that tones are still present inside the audio band.

Figure 8:
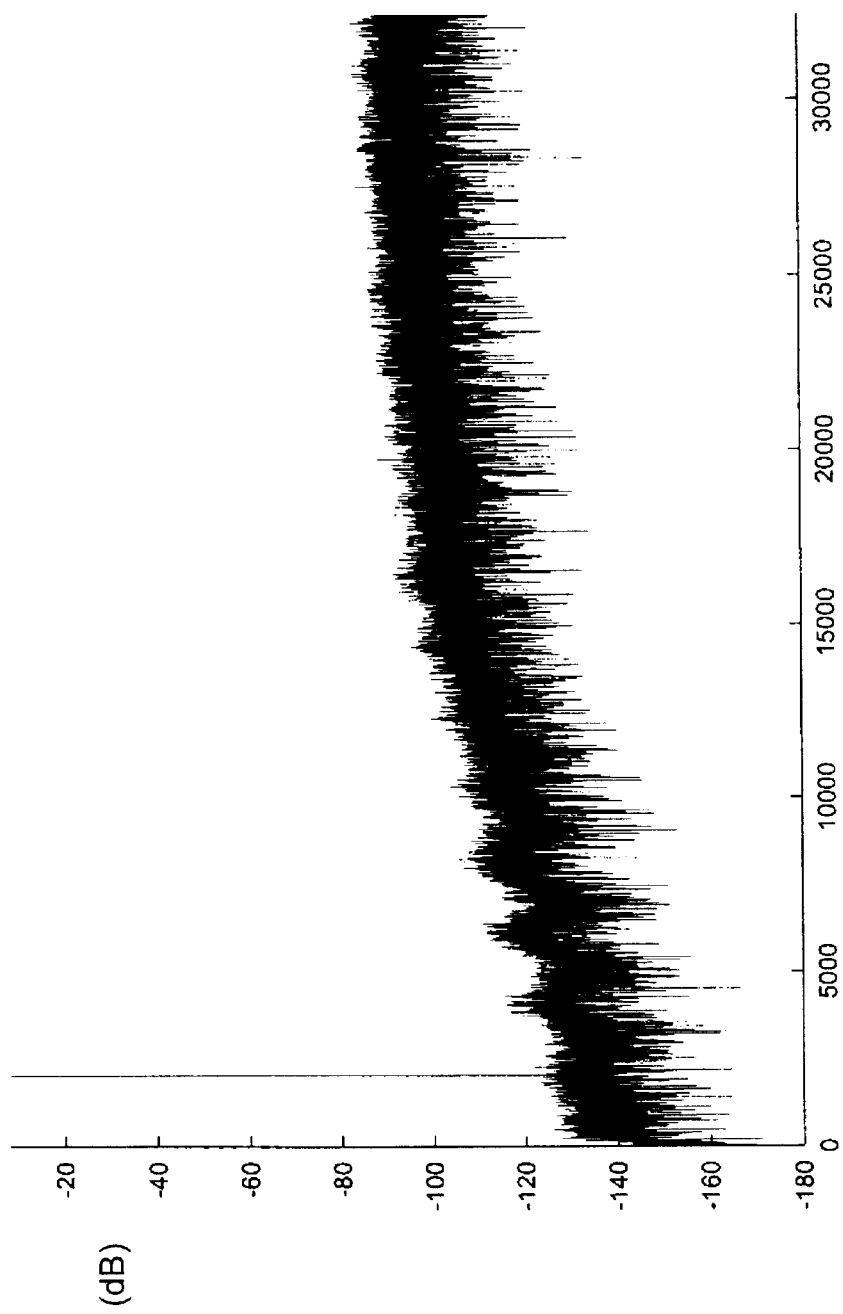
FIG. 8 is a plot illustrating a second order SDM output spectrum for a single input tone employing dither pointer averaging type dynamic element matching in accordance with the present invention.
Figure 9:
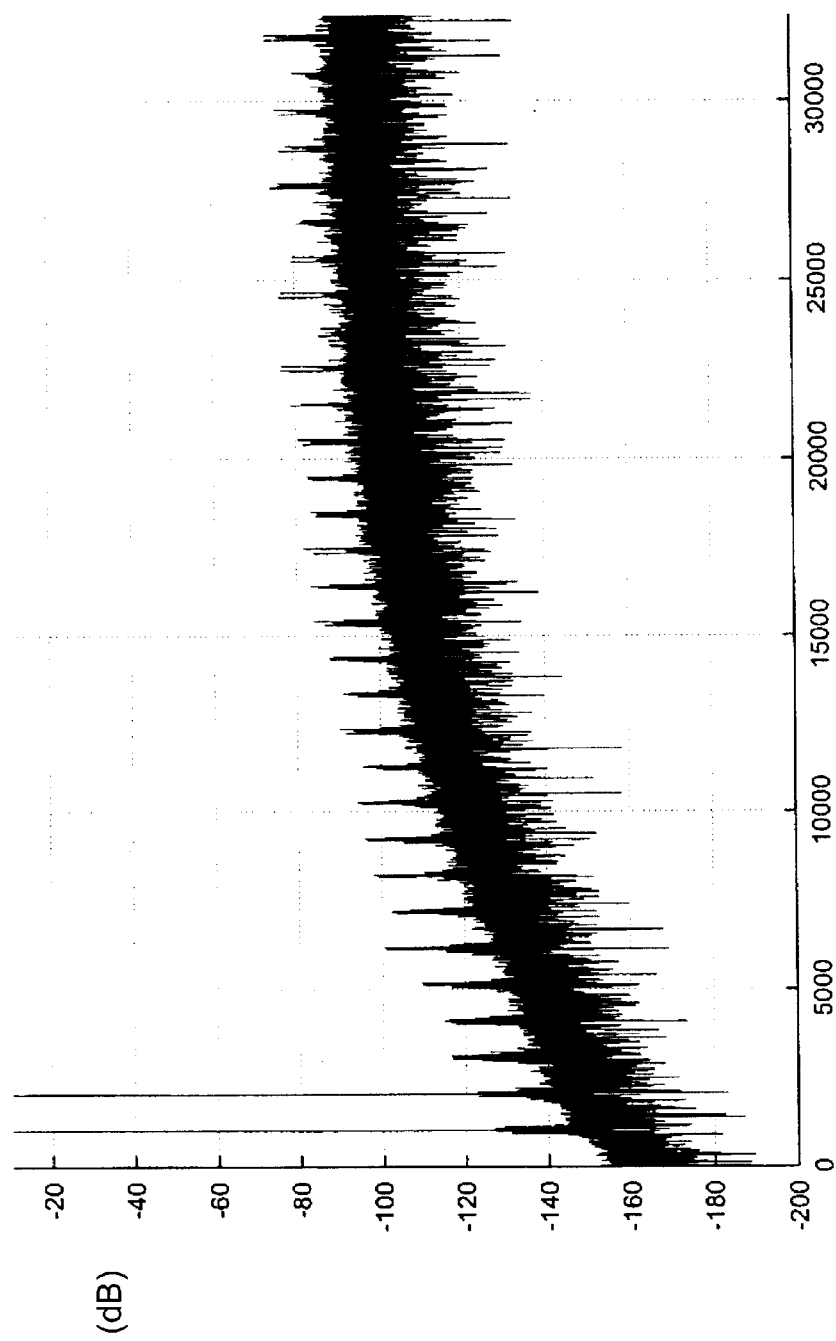
FIG. 9 is a plot illustrating a second order SDM output spectrum for two input tones employing DWA type dynamic element matching.

FIG. 8 provides a plot 74 illustrating the SDM output spectrum for the single input tone employing the DPA DEM system 30' in the modulator 2 of FIGS. 1 and 4A in accordance with the present invention. The plot 74 demonstrates that the dynamic element matching techniques of the invention operate to disperse and remove the unwanted tones, resulting in improved D/A SFDR performance. In the simulation results illustrated in FIG. 8, for example, an SFDR of 120 dB is provided at an OSR of 8, and an SFDR of 104 dB is achieved at an OSR of 4. In addition, the tones outside the audible band are also smoothed, thus facilitating design of the decimation filter (e.g., filter 28 in FIG. 1). Simulation results for DWA and DPA DEM systems are illustrated in plots 76 and 78 of FIGS. 9 and 10, respectively, for two input tones at about −7 dB. As can be seen in the DWA plot 76 of FIG. 9, two tone harmonic distortion components appear in the output spectrum. Conversely, in the DPA plot 78 of FIG. 10, these tones are removed, and the SFDR is significantly improved.

Thus, the various aspects of the invention may be employed to achieve SFDR advances beyond the capabilities of DWA DEM techniques. Unlike DWA type DEM algorithms, the DPA techniques of the current invention employ both the incoming digital code and a signal which is dependent upon an independent dithering system to update the pointer DEM code, by which the dithering sequence breaks the repeating pattern found in DWA DEM approaches. In this manner, the D/A error is not only shaped into higher frequencies, but also, the tone energy is dispersed to a degree controlled by the dithering sequence, which can be, for example, a pseudo random number sequence, or the residual quantization noise from the quantizer, or simply a constant. Thus, for example, the dither system 40 in the exemplary DEM system 30 above may be a very simple design providing a constant binary dither value or signal to the DEM code system 42.1

Referring now to FIGS. 1 and 4C, another exemplary DPA DEM system 30" is illustrated, comprising a dither system 40 and an m-bit barrel shifter switching system 44'. A DEM code system 42" is provided, comprising a thermometer-to-binary code converter circuit 54, an adder 50, and a pointer accumulator 58 as described above. In the DEM code system 42", the adder circuit 50 selectively sums the dither code 40' and the digital input code to generate an n+1 bit intermediate sum code 56' according to a cycle status 80 associated with the previous DEM code $P_0 \ldots P_{n-1}$. In this implementation, the DEM code system 42" also comprises a cycle detector circuit 82 receiving the previous DEM code $P_0 \ldots P_{n-1}$ and providing the cycle status signal 80 to the adder 50 according to a cycle status associated with the previous DEM code $P_0 \ldots P_{n-1}$. In one example, the cycle status may be representative of a wrap around condition in the pointer accumulator 58, wherein the status signal 80 may be a carry bit output of the accumulator 58. The code system 42" further comprises a gate circuit 84 receiving the cycle status signal 80 and the dither code 40', which selectively provides a dither code 40" to the adder circuit according to the cycle status signal 80. Thus, when the pointer accumulator has cycled past the last value (e.g., 31 in this example), the cycle detector 82 asserts the status signal 80, whereby the gate 84 passes the dither code 40' to the adder 50. In this manner, the dither code is selectively employed in computation of the DEM code $P_0 \ldots P_{n-1}$.

Figure 11:
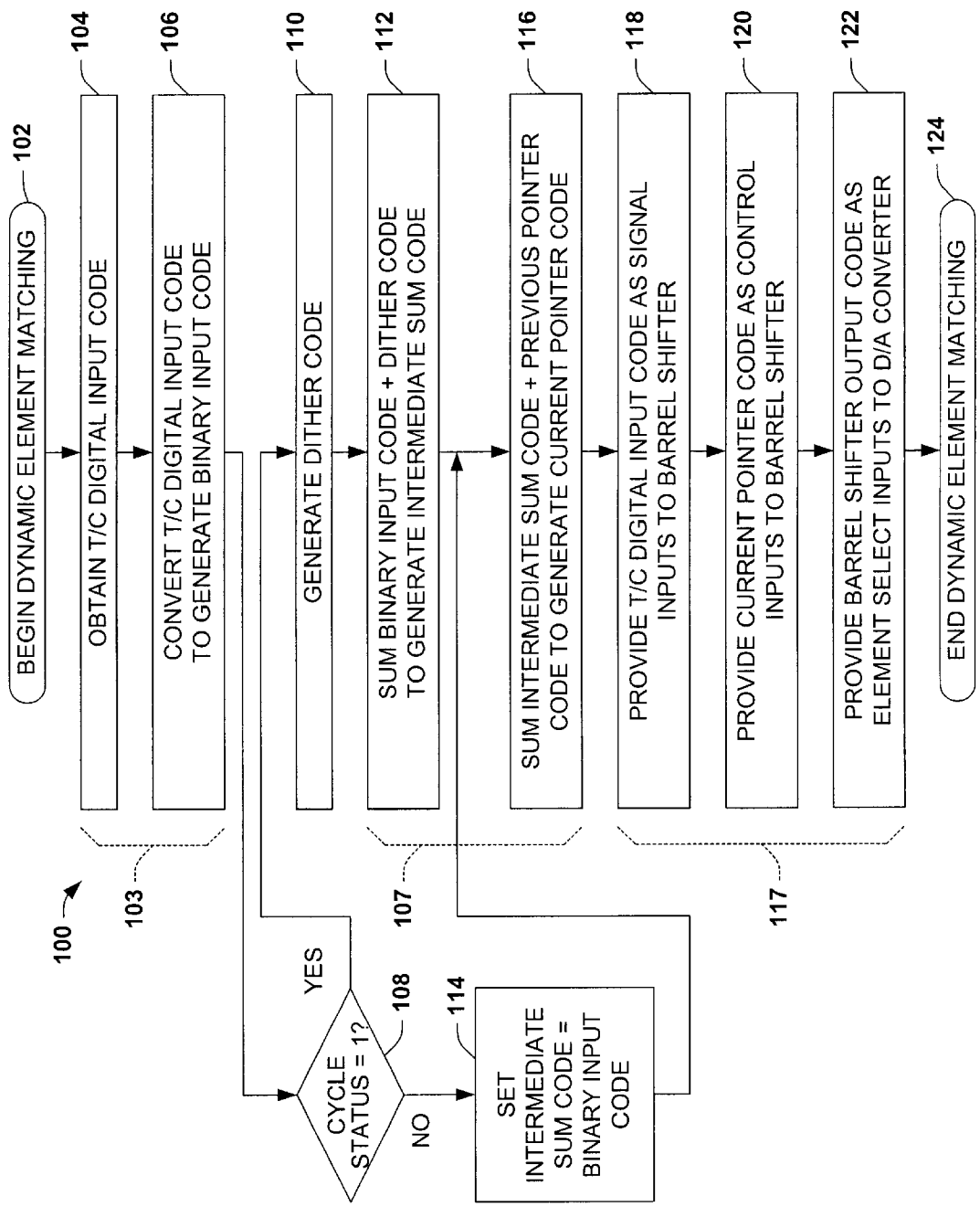
FIG. 11 is a flow diagram illustrating an exemplary method of dynamic element matching to select D/A converter elements in accordance with another aspect of the present invention.

Another aspect of the invention provides DEM methods for selecting D/A converter elements according to a digital input code, wherein an exemplary method 100 is illustrated in FIG. 11. Although the exemplary method 100 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the operation of the sigma delta modulators, D/A converters, and DEM systems therefor which are illustrated and described herein as well as in association with other systems and devices not illustrated. For example, the exemplary method 100 may be employed in association with the exemplary DEM systems 30' and/or 30" in the modulator 2 in FIGS. 1, 4A, and 4C above.

Beginning at 102, the method 102 broadly provides for receiving a digital input code at 103, generating a dither code at 110, and generating a current DEM code at 107 according to a previous DEM code, the dither code, and the digital input code. The method 100 further provides for selecting D/A elements according to the digital input code and the current DEM code at 117. At 104, a digital input code is obtained, which may be in any code type or format, such as the thermometer coded digital input code $D_0 \ldots D_{n-1}$ above. The thermometer code is converted to a binary input code (e.g., code 52 in FIG. 4A) at 106. For the DEM system 30" of FIG. 4C, a determination is then made at 108 as to whether the cycle status is a first status (e.g., the cycle status signal 80 in FIG. 4C indicates that the pointer accumulator 58 has completed a cycle). If so, the method 100 proceeds to 110 where a dither code (e.g., code 40' above) is generated, before the current DEM code is generated at 107. At 112, the binary input code and the dither code are summed to generate an intermediate sum code, which is then summed with the previous pointer code at 116 to generate the current pointer code.

Figure 10:
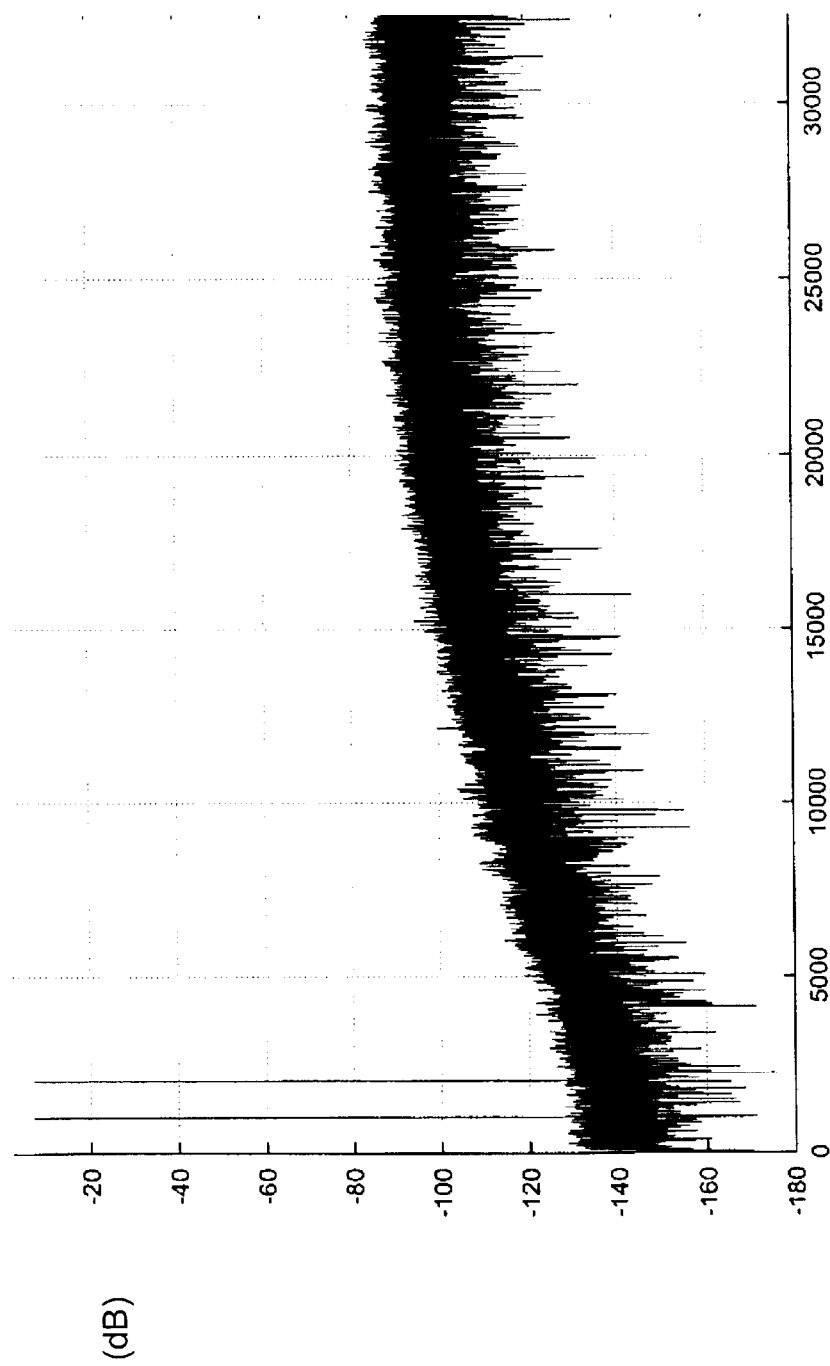
FIG. 10 is a plot illustrating a second order SDM output spectrum for two input tones employing dither pointer averaging type dynamic element matching in accordance with the present invention.

In the implementation of FIG. 4C above, where the cycle status signal is not asserted (e.g., NO at 114), the intermediate sum code is set to the binary input code at 114, such as by the gate 84 (FIG. 4C) refraining from providing the dither code 40' to the adder 50. In this case, the method 100 then proceeds to 116, where the intermediate sum code is summed with the previous pointer code to generate the current pointer code. At 118, the digital input code is provided as signal inputs to the switching system (e.g., input code $D_0 \ldots D_{n-1}$ is provided to the barrel shifter 44' in FIGS. 4A and 4C), and the current DEM pointer code is provided as control inputs to the barrel shifter at 120. At 122, the barrel shifter output code (e.g., select signals $S_0 \ldots S_{m-1}$) is provided as element select inputs to a D/A converter before the method 100 ends at 124. The method 100 may be repeated for each conversion cycle, for example, to generate the analog feedback signals FB1 and FB2 in the SDM 2 of FIG. 1, wherein the selective or constant use of the dither code in generating the pointer code may facilitate improved conversion performance, such as increasing the SFDR of a D/A converter, as illustrated in FIGS. 8 and 10 above.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A dynamic element matching system for selecting D/A converter elements according to a digital input code, comprising:

a dither system generating a dither code;

a DEM code system receiving the dither code and the digital input code, and generating a current DEM code according to a previous DEM code, the dither code, and the digital input code; and a switching system receiving the digital input code and the current DEM code, and generating select signals for selecting D/A elements according to the digital input code and one of the current DEM code and the previous DEM code.

2. The dynamic element matching system of claim 1, wherein the dither system is operable to generate the dither code as a pseudo-random code, as a code representative of quantization noise associated with a quantizer, or as a code representative of a non-zero constant value.

3. The dynamic element matching system of claim 2, wherein the switching system comprises a barrel shifter circuit, the barrel shifter circuit comprising:

a plurality of signal inputs receiving the digital input code;

a plurality of control inputs receiving one of the current DEM code and the previous DEM code from the DEM code system; and a plurality of outputs providing the digital input code as select signals for selecting D/A elements, wherein the digital, input code is shifted at the outputs according to one of the current DEM code and the previous DEM code at the control inputs.

4. The dynamic element matching system of claim 1, wherein the switching system comprises a barrel shifter circuit, the barrel shifter circuit comprising:

a plurality of signal inputs receiving the digital input code;

a plurality of control inputs receiving one of the current DEM code and the previous DEM code from the DEM code system; and a plurality of outputs providing the digital input code as select signals for selecting D/A elements, wherein the digital input code is shifted at the outputs according to one of the current DEM code and the previous DEM code at the control inputs.

5. The dynamic element matching system of claim 1, wherein the DEM code system comprises:

an adder circuit receiving the dither code and the digital input code, the adder circuit summing the dither code and the digital input code to generate an intermediate sum code; and an accumulator receiving the intermediate sum code, the accumulator summing the intermediate sum code and the previous DEM code to generate the current DEM code.

6. The dynamic element matching system of claim 5, wherein the digital input code is a thermometer code, wherein the dither code and the current DEM code are binary codes, wherein the DEM code system further comprises a converter circuit receiving the digital input code and converting the digital input code to a binary input code, and wherein the adder receives the dither code and the binary input code and sums the dither code and the binary input code to generate the intermediate sum code.

7. The dynamic element matching system of claim 6, wherein the dither system is operable to generate the dither code as a pseudo-random code, as a code representative of quantization noise associated with a quantizer, or as a code representative of a non-zero constant value.

8. The dynamic element matching system of claim 7, wherein the switching system comprises a barrel shifter circuit, the barrel shifter circuit comprising:
   a plurality of signal inputs receiving the digital input code;
   a plurality of control inputs receiving one of the current DEM code and the previous DEM code from the DEM code system; and
   a plurality of outputs providing the digital input code as select signals for selecting D/A elements, wherein the digital input code is shifted at the outputs according to one of the current DEM code and the previous DEM code at the control inputs.

9. The dynamic element matching system of claim 6, wherein the switching system comprises a barrel shifter circuit, the barrel shifter circuit comprising:
   a plurality of signal inputs receiving the digital input code;
   a plurality of control inputs receiving one of the current DEM code and the previous DEM code from the DEM code system; and
   a plurality of outputs providing the digital input code as select signals for selecting D/A elements, wherein the digital input code is shifted at the outputs according to one of the current DEM code and the previous DEM code at the control inputs.

10. The dynamic element matching system of claim 5, wherein the dither system is operable to generate the dither code as a pseudo-random code, as a code representative of quantization noise associated with a quantizer, or as a code representative of a non-zero constant value.

11. The dynamic element matching system of claim 10, wherein the switching system comprises a barrel shifter circuit, the barrel shifter circuit comprising:
   a plurality of signal inputs receiving the digital input code;
   a plurality of control inputs receiving one of the current DEM code and the previous DEM code from the DEM code system; and
   a plurality of outputs providing the digital input code as select signals for selecting D/A elements, wherein the digital input code is shifted at the outputs according to one of the current DEM code and the previous DEM code at the control inputs.

12. The dynamic element matching system of claim 5, wherein the switching system comprises a barrel shifter circuit, the barrel shifter circuit comprising:
   a plurality of signal inputs receiving the digital input code;
   a plurality of control inputs receiving one of the current DEM code and the previous DEM code from the DEM code system; and
   a plurality of outputs providing the digital input code as select signals for selecting D/A elements, wherein the digital input code is shifted at the outputs according to one of the current DEM code and the previous DEM code at the control inputs.

13. The dynamic element matching system of claim 1, wherein the DEM code system comprises:
   an adder circuit receiving the dither code and the digital input code, the adder circuit selectively summing the dither code and the digital input code to generate an intermediate sum code according to a cycle status associated with the previous DEM code; and
   an accumulator receiving the intermediate sum code, the accumulator summing the intermediate sum code and the previous DEM code to generate the current DEM code.

14. The dynamic element matching system of claim 13, wherein the DEM code system further comprises:
   a cycle detector circuit receiving the previous DEM code and providing a cycle status signal according to a cycle status associated with the previous DEM code; and
   a gate circuit receiving the cycle status signal and the dither code, the gate circuit selectively providing the dither code to the adder circuit according to the cycle status signal.

15. The dynamic element matching system of claim 14, wherein the digital input code is a thermometer code, wherein the dither code and the current DEM code are binary codes, wherein the DEM code system further comprises a converter circuit receiving the digital input code and converting the digital input code to a binary input code, and wherein the adder receives the dither code and the binary input code and sums the dither code and the binary input code to generate the intermediate sum code.

16. The dynamic element matching system of claim 15, wherein the dither system is operable to generate the dither code as a pseudo-random code, as a code representative of quantization noise associated with a quantizer, or as a code representative of a non-zero constant value.

17. The dynamic element matching system of claim 16, wherein the switching system comprises a barrel shifter circuit, the barrel shifter circuit comprising:
   a plurality of signal inputs receiving the digital input code;
   a plurality of control inputs receiving one of the current DEM code and the previous DEM code from the DEM code system; and
   a plurality of outputs providing the digital input code as select signals for selecting D/A elements, wherein the digital input code is shifted at the outputs according to one of the current DEM code and the previous DEM code at the control inputs.

18. The dynamic element matching system of claim 15, wherein the switching system comprises a barrel shifter circuit, the barrel shifter circuit comprising:
   a plurality of signal inputs receiving the digital input code;
   a plurality of control inputs receiving one of the current DEM code and the previous DEM code from the DEM code system; and
   a plurality of outputs providing the digital input code as select signals for selecting D/A elements, wherein the digital input code is shifted at the outputs according to one of the current DEM code and the previous DEM code at the control inputs.

19. The dynamic element matching system of claim 14, wherein the dither system is operable to generate the dither code as a pseudo-random code, as a code representative of quantization noise associated with a quantizer, or as a code representative of a non-zero constant value.

20. The dynamic element matching system of claim 19, wherein the switching system comprises a barrel shifter circuit, the barrel shifter circuit comprising:
   a plurality of signal inputs receiving the digital input code;
   a plurality of control inputs receiving one of the current DEM code and the previous DEM code from the DEM code system; and
   a plurality of outputs providing the digital input code as select signals for selecting D/A elements, wherein the digital input code is shifted at the outputs according to one of the current DEM code and the previous DEM code at the control inputs.

21. The dynamic element matching system of claim 14, wherein the switching system comprises a barrel shifter circuit, the barrel shifter circuit comprising:
   a plurality of signal inputs receiving the digital input code;
   a plurality of control inputs receiving one of the current DEM code and the previous DEM code from the DEM code system; and
   a plurality of outputs providing the digital input code as select signals for selecting D/A elements, wherein the digital input code is shifted at the outputs according to one of the current DEM code and the previous DEM code at the control inputs.

22. The dynamic element matching system of claim 13, wherein the dither system is operable to generate the dither code as a pseudo-random code, as a code representative of quantization noise associated with a quantizer, or as a code representative of a non-zero constant value.

23. The dynamic element matching system of claim 22, wherein the switching system comprises a barrel shifter circuit, the barrel shifter circuit comprising:
   a plurality of signal inputs receiving the digital input code;
   a plurality of control inputs receiving one of the current DEM code and the previous DEM code from the DEM code system; and
   a plurality of outputs providing the digital input code as select signals for selecting D/A elements, wherein the digital input code is shifted at the outputs according to one-of the current DEM code and the previous DEM code at the control inputs.

24. The dynamic element matching system of claim 13, wherein the switching system comprises a barrel shifter circuit, the barrel shifter circuit comprising:
   a plurality of signal inputs receiving the digital input code;
   a plurality of control inputs receiving one of the current DEM code and the previous DEM code from the DEM code system; and
   a plurality of outputs providing the digital input code as select signals for selecting D/A elements, wherein the digital input code is shifted at the outputs according to one of the current DEM code and the previous DEM code at the control inputs.

25. A sigma delta modulator, comprising:
   at least one filter receiving an input signal and an analog feedback signal, the filter providing a filtered output signal according to the input signal and the analog feedback signal;
   a quantizer coupled with the filter and providing a quantized output signal according to the filtered output signal;
   a D/A converter coupled with the filter, the D/A converter comprising a plurality of selectable D/A elements, the D/A converter providing the analog feedback signal corresponding to the quantized output signal using D/A elements selected according to the quantized output signal; and
   a dynamic element matching system coupled with the D/A converter and the quantizer, the dynamic element matching system being adapted to vary the selection of D/A elements of the D/A converter, wherein the dynamic element matching system comprises:
   a dither system generating a dither code;
   a DEM code system receiving the dither code and the quantized output signal, and generating a current DEM code according to a previous DEM code, the dither code, and the quantized output signal; and
   a switching system receiving the quantized output signal and one of the current DEM code and the previous DEM code, and generating select signals for selecting D/A elements according to the quantized output signal and one of the current DEM code and the previous DEM code.

26. A data conversion system, comprising:
   a D/A converter comprising a plurality of selectable D/A elements, the D/A converter providing an analog output signal corresponding to a digital input code using D/A elements selected according to the digital input code; and
   a dynamic element matching system coupled with the D/A converter the dynamic element matching system being adapted to vary the selection of D/A elements of the D/A converter, wherein the dynamic element matching system comprises:
   a dither system generating a dither code;
   a DEM code system receiving the dither code and the digital input code, and generating a current DEM code according to a previous DEM code, the dither code, and the digital input code; and
   a switching system receiving the digital input code and one of the current DEM code and the previous DEM code, and generating select signals for selecting D/A elements according to the digital input code and one of the current DEM code and the previous DEM code.

27. The system of claim 26, wherein the dither system is operable to generate the dither code as a pseudo-random code, as a code representative of quantization noise associated with a quantizer, or as a code representative of a non-zero constant value.

28. The system of claim 26, wherein the switching system comprises a barrel shifter circuit, the barrel shifter circuit comprising:
   a plurality of signal inputs receiving the digital input code;
   a plurality of control inputs receiving one of the current DEM code and the previous DEM code from the DEM code system; and
   a plurality of outputs providing the digital input code as select signals for selecting D/A elements, wherein the digital input code is shifted at the outputs according to one of the current DEM code and the previous DEM code at the control inputs.

29. The system of claim 26, wherein the DEM code system comprises:
   an adder circuit receiving the dither code and the digital input code, the adder circuit summing the dither code and the digital input code to generate an intermediate sum code; and
   an accumulator receiving the intermediate sum code, the accumulator summing the intermediate sum code and the previous DEM code to generate the current DEM code.

30. The system of claim 29, wherein the digital input code is a thermometer code, wherein the dither code and the current DEM code are binary codes, wherein the DEM code system further comprises a converter circuit receiving the digital input code and converting the digital input code to a binary input code, and wherein the adder receives the dither code and the binary input code and sums the dither code and the binary input code to generate the intermediate sum code.

31. The system of claim 26, wherein the DEM code system comprises:
   an adder circuit receiving the dither code and the digital input code, the adder circuit selectively summing the dither code and the digital input code to generate an intermediate sum code according to a cycle status associated with the previous DEM code; and
   an accumulator receiving the intermediate sum code, the accumulator summing the intermediate sum code and the previous DEM code to generate the current DEM code.

32. The system of claim 31, wherein the DEM code system further comprises:
   a cycle detector circuit receiving the previous DEM code and providing a cycle status signal according to a cycle status associated with the previous DEM code; and
   a gate circuit receiving the cycle status signal and the dither code, the gate circuit selectively providing the dither code to the adder circuit according to the cycle status signal.

33. The system of claim 32, wherein the digital input code is a thermometer code, wherein the dither code and the current DEM code are binary codes, wherein the DEM code system further comprises a converter circuit receiving the digital input code and converting the digital input code to a binary input code, and wherein the adder receives the dither code and the binary input code and sums the dither code and the binary input code to generate the intermediate sum code.

34. A method of selecting D/A converter elements according to a digital input code, the method comprising:
   receiving a digital input code;
   generating a dither code;
   generating a current DEM code according to a previous DEM code, the dither code, and the digital input code; and
   selecting D/A elements according to the digital input code and one of the current DEM code and the previous DEM code.

35. The method of claim 34, further comprising converting the digital input code to a binary input code, wherein the current DEM code is generated according to the previous DEM code, the dither code, and the binary input code.

36. The method of claim 34, wherein the dither code is generated as a pseudo-random code, as a code representative of quantization noise associated with a quantizer, or as a code representative of a non-zero constant value.

37. The method of claim 34, wherein generating the current DEM code comprises:
   determining a cycle status associated with the previous DEM code;
   selectively summing the dither code and the digital input code to generate an intermediate sum code according to the cycle status; and
   summing the intermediate sum code and the previous DEM code to generate the current DEM code.

38. The method of claim 37, wherein selectively summing the dither code and the digital input code comprises:
   selectively summing the dither code and the digital input code to generate the intermediate sum code if the cycle status is a first status; and
   selectively setting the intermediate sum code equal to the digital input code if the cycle status is not the first status.

* * * * *